(12) United States Patent
Takada et al.

(10) Patent No.: US 6,980,061 B2
(45) Date of Patent: Dec. 27, 2005

(54) VOLTAGE-CONTROLLED OSCILLATOR

(75) Inventors: Yutaka Takada, Minami-Minowa-Mura (JP); Kenji Suzuki, Nagoya (JP); Tatsuya Tsuruoka, Ena (JP)

(73) Assignees: Seiko Epson Corporation, Tokyo (JP); NGK Insulators, Ltd., Nagoya (JP)

( * ) Notice: Subject to any disclaimer, the term of this patent is extended or adjusted under 35 U.S.C. 154(b) by 39 days.

(21) Appl. No.: 10/836,195

(22) Filed: May 3, 2004

(65) Prior Publication Data

US 2005/0001690 A1  Jan. 6, 2005

(30) Foreign Application Priority Data

Jun. 4, 2003  (JP)  .............................. 2003-159700

(51) Int. Cl.[7] .............................................. H03B 5/32
(52) U.S. Cl. ...................... 331/107 A; 331/34; 331/74; 331/107 SL; 331/108 C; 331/135; 333/150
(58) Field of Search ...................... 331/107 A, 107 SL, 331/108 C, 34, 74, 135, 150

(56) References Cited

U.S. PATENT DOCUMENTS

| | | | | |
|---|---|---|---|---|
| 4,325,032 A | * | 4/1982 | Gilden | 331/25 |
| 4,639,697 A | * | 1/1987 | Yarranton et al. | 333/155 |
| 4,871,984 A | * | 10/1989 | Laton et al. | 331/107 A |
| 5,039,957 A | * | 8/1991 | Greer et al. | 331/107 A |
| 5,874,866 A | * | 2/1999 | Satoh et al. | 331/107 A |
| 6,727,767 B2 | * | 4/2004 | Takada | 331/107 A |

FOREIGN PATENT DOCUMENTS

| | | |
|---|---|---|
| EP | 0 878 902 A1 | 11/1998 |
| EP | 1 172 882 A2 | 1/2002 |
| EP | 1 298 790 A1 | 4/2003 |
| JP | U 6-2746 | 1/1994 |
| JP | A-2001-139373 | 5/2001 |
| JP | A 2002-026654 | 1/2002 |

* cited by examiner

Primary Examiner—Zandra Smith
Assistant Examiner—James Goodley
(74) Attorney, Agent, or Firm—Oliff & Berridge, PLC

(57) ABSTRACT

The problem of interference and coupling between circuits that arises in reducing the size of a voltage-controlled oscillator by using low temperature co-fired ceramics (LTCC) substrate technology is alleviated. A voltage-controlled oscillator includes an amplifier a surface acoustic wave device 15 that forms a feedback circuit for the amplifier; a frequency adjuster that is provided the feedback circuit and has a filter configuration; a phase shifter 13 including a hybrid coupler having an additional controller that receives a control voltage from an external source and changes a phase in an oscillation loop; an equal power distributor 12 that equally distributes output power in the oscillation loop and outputs the power to the outside of the oscillation loop; and a delay line 16 concentratedly provided a place where coupling or interference does not occur the oscillation loop for correcting a phase condition in the oscillation loop.

9 Claims, 6 Drawing Sheets

VOLTAGE-CONTROLLED OSCILLATOR

BACKGROUND OF THE INVENTION

1. Field of the Invention

The present invention relates to a voltage-controlled oscillator including a feedback circuit that uses a surface acoustic wave device as a resonator.

2. Description of the Related Art

As high-frequency oscillators, there have been proposed voltage-controlled oscillators using microstrip lines as resonators (for example, see patent document 1) and voltage-controlled oscillators using strip lines as resonators (for example, see patent document 2). However, a problem with these voltage-controlled oscillators using such resonators is that, unlike surface acoustic wave devices with piezoelectric effect of a crystal substrate, the resonators cannot provide large Q values and therefore cannot provide high-quality signals.

Low Temperature Co-fired Ceramics (LTCC) substrate technology is typically used in order to reduce the size of oscillators. The LTCC substrate technology allows passive elements such as capacitors and inductances to be provided as layers in a ceramic substrate. That is, passive components such as chip capacitors and chip inductors, which conventionally have been mounted on a substrate, can be contained in a ceramic substrate. Therefore, the number of surface-mounted components in a voltage-controlled oscillator can be drastically reduced and the size of the entire oscillator can be reduced.

(Patent Document 1)
Japanese Patent Laid-Open No. 2002-26654 (pp. 1–3, FIG. 1)

(Patent Document 2)
Japanese Utility Model Laid-Open No. 06-2746 (p. 1, FIG. 1)

SUMMARY OF THE INVENTION

However, the above-described LTCC technology has an unsolved problem that, if the packaging density of the components in a ceramic substrate is increased in order to achieve further size reduction, the distance between embedded circuit blocks and the distance between a block and a ground are decreased, which may cause interference or coupling between circuits, resulting in degradation in oscillation characteristics and abnormal oscillation, which does not provide oscillation at a normal frequency. The problem of interference and coupling between inner circuits can be solved by providing spacing between the circuits that is sufficiently large enough to prevent such interference and coupling. However, this solution is incompatible with the demand for size reduction.

The present invention has been made in order to solve the unsolved problem with the prior art and an object of the present invention therefore is to provide a voltage-controlled oscillator that alleviates the problem of interference and coupling between circuits which arises in reducing the size of a voltage-controlled oscillator by the LTCC substrate technology.

A first technical implementation includes an amplifier; a surface acoustic wave device that forms a feedback circuit for the amplifier; a frequency adjuster that is provided in the feedback circuit and has a filter configuration; a phase shifter including a hybrid coupler having an additional controller that receives a control voltage from an external source and changes a phase in an oscillation loop; an equal power distributor that equally distributes output power in the oscillation loop and outputs the power to the outside of the oscillation loop; and a delay line concentratedly provided in a place in the oscillation loop where coupling or interference does not occur for correcting a phase condition in the oscillation loop.

In the first technical implementation, the delay lines, which were dispersed between circuit blocks, are concentrated in a place where coupling or interference does not occur, thereby minimizing the coupling and interference between circuit blocks and the delay lines and allowing stable oscillation.

A second technical implementation is characterized in that the phase shifter, the equal power distributor, and the delay line in the first technical implementation are provided in a low temperature co-fired ceramics (LTCC) substrate.

In the second technical implementation, the phase shifter including a hybrid coupler, the equal power distributor, the delay line, and wirings that connect circuits can be contained in the ceramic substrate. Therefore, the number of surface-mounted components of a voltage-controlled oscillator can substantially be reduced and the size of the entire oscillator can also be reduced. In addition, stable oscillation with less coupling and interference can be achieved.

A third technical implementation is characterized in that the delay line in the first or second technical implementation is provided between the frequency adjuster and the phase shifter.

In the third technical implementation, the delay line is provided between the frequency adjuster and the phase shifter, which are less prone to couple with the delay line. Therefore, the problem of coupling and interference can be substantially alleviated and a stable voltage-controlled oscillator without abnormal oscillation can be provided.

A fourth technical implementation is characterized in that the delay line in the first or second implementation is provided between the amplifier and the phase shifter.

In the fourth implementation, the delay line is provided between the amplifier and the phase shifter, which are less prone to couple with the delay line. Therefore, the problem of coupling and interference can be substantially alleviated and a stable voltage-controlled oscillator without abnormal oscillation can be provided.

A fifth technical implementation is characterized in that the delay line in any of the second to fourth implementation is separated by a ground layer in the lamination direction in a layer above or below a dielectric layer on which the phase shifter and the equal power distributor are provided.

In the fifth implementation, the delay line is formed on a different layer from the dielectric layer on which the phase shifter and the equal power distributor are provided, which are prone to couple and interference with the delay line, and separated from the dielectric layer by the ground layer, sufficient isolation can be ensured. Consequently, stable variable characteristics and output power characteristics with minimized variations can be achieved.

BRIEF DESCRIPTION OF THE DRAWINGS

FIGS. 4A and 4B show characteristics in an embodiment of the present invention, in which FIG. 4A shows loop gain versus frequency and FIG. 4B shows loop phase versus frequency;

FIGS. 5A and 5B show characteristics in an example of the prior art, in which FIG. 5A shows loop gain versus frequency and FIG. 5B shows loop phase versus frequency;

DETAILED DESCRIPTION OF THE PREFERRED EMBODIMENTS

Embodiments of the present invention will be described below with reference to the accompanying drawings.

Figure 1:
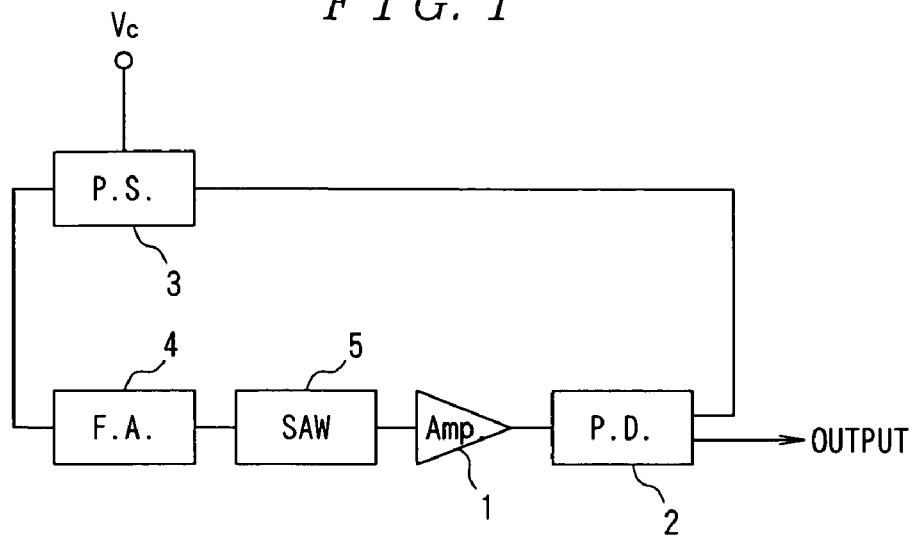
FIG. 1 is a block diagram showing a configuration of a voltage-controlled oscillator according to a first embodiment of the present invention.

FIG. 1 is a block diagram showing a configuration of a voltage-controlled oscillator according to a first embodiment of the present invention.

In FIG. 1, an equal power distributor 2 equally distributing output power in an oscillation loop and outputting the distributed power to the outside of the loop, a phase shifter 3 receiving a control voltage Vc from an outside source and changing the phase in the oscillation loop, a frequency adjuster 4 finely adjusting the phase in the oscillation loop, and a surface acoustic wave device 5 are provided in series as a feedback circuit on the input and output sides of an amplifier 1 for oscillation. These blocks are connected with each other and their impedance is matched to constant characteristic impedance, for example 50 ohms.

Figure 2:
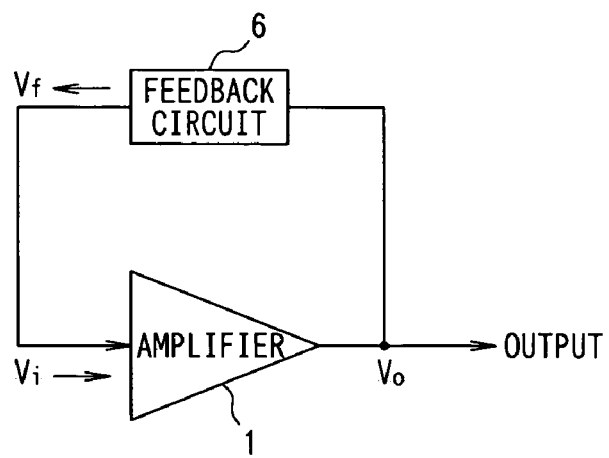
FIG. 2 is a block diagram showing a configuration of a feedback oscillator according to an embodiment of the present invention.

FIG. 2 is a block diagram showing a configuration of a feedback oscillator according to an embodiment of the present invention. Operation of the voltage-controlled oscillator shown in FIG. 1 will be described below. In the description, the equal power distributor 2, phase shifter 3, frequency regulator 4, and surface acoustic wave device 5 are referred to as a feedback circuit 6.

In FIG. 2, the voltage-controlled oscillator shown in FIG. 1 can be considered a feedback oscillator where the feedback circuit 6 is connected to the amplifier 1.

When an input voltage Vi appears at the input of the amplifier 1, an output voltage Vo, which the input voltage Vi is multiplied by G (=Vi*G), appears at its output. The output voltage Vo is passed through the feedback circuit 6 with a feedback factor β and a feedback voltage Vf (Vf=Vo*β=Vi*G*β) is returned to the input.

If the feedback voltage Vf is identical to the input voltage Vi in phase, the feedback voltage Vf is higher than the input voltage Vi, that is, consequently positive feedback is provided, causing oscillation.

Here, let the phase of the input voltage Vi be θi, the phase of the feedback voltage Vf be θf, the phase change in the amplifier 1 be θc, and the phase change in the feedback circuit 6 be θβ, then the following expression (1) should hold in order to cause oscillation.

$$Vi*G*\beta*\exp(j(\theta i+\theta c+\theta\beta)) \geq Vi*\exp(j(2\pi+\theta i)) \quad (1)$$

In expression (1), after the input voltage Vi loops through the amplifier 1 and the feedback circuit 6 back to the input, its phase should be the same as its initial phase at the time when it was inputted.

That is, the following expressions should hold.

$$\theta c+\theta\beta=2n\pi, (n=0, 1, 2, \ldots) \quad (2)$$

$$G*\beta>1 \quad (3)$$

Expression (2) represents the phase condition for causing oscillation of the oscillator and expression (3) represents the amplitude condition for causing oscillation of the oscillator.

In practice, as the feedback voltage Vf increases, the output voltage Vo of the amplifier 1 will saturate and become a steady state, that is, $G*\beta=1$.

The oscillation frequency of the voltage-controlled oscillator shown in FIG. 1 can be changed by changing the phase θβ of the feedback circuit 6 with the phase shifter 3.

A −3 dB 90° hybrid coupler and an associated variable reactance circuit can be used as the phase shifter 3 to widen the frequency variable range of the voltage-controlled oscillator. Consequently, a good frequency variable characteristic can be achieved with the control voltage Vc.

Furthermore, because the insertion loss and return loss are low, the circuit loss can be minimized. Thus, an efficient voltage-controlled oscillator with minimized output variations can be provided.

Moreover, because the equal power distributor 2 can equally distribute output power and output the power from the oscillation loop without disturbing the impedance in the oscillation loop, a stable circuit operation can be performed on a load.

Figure 3:
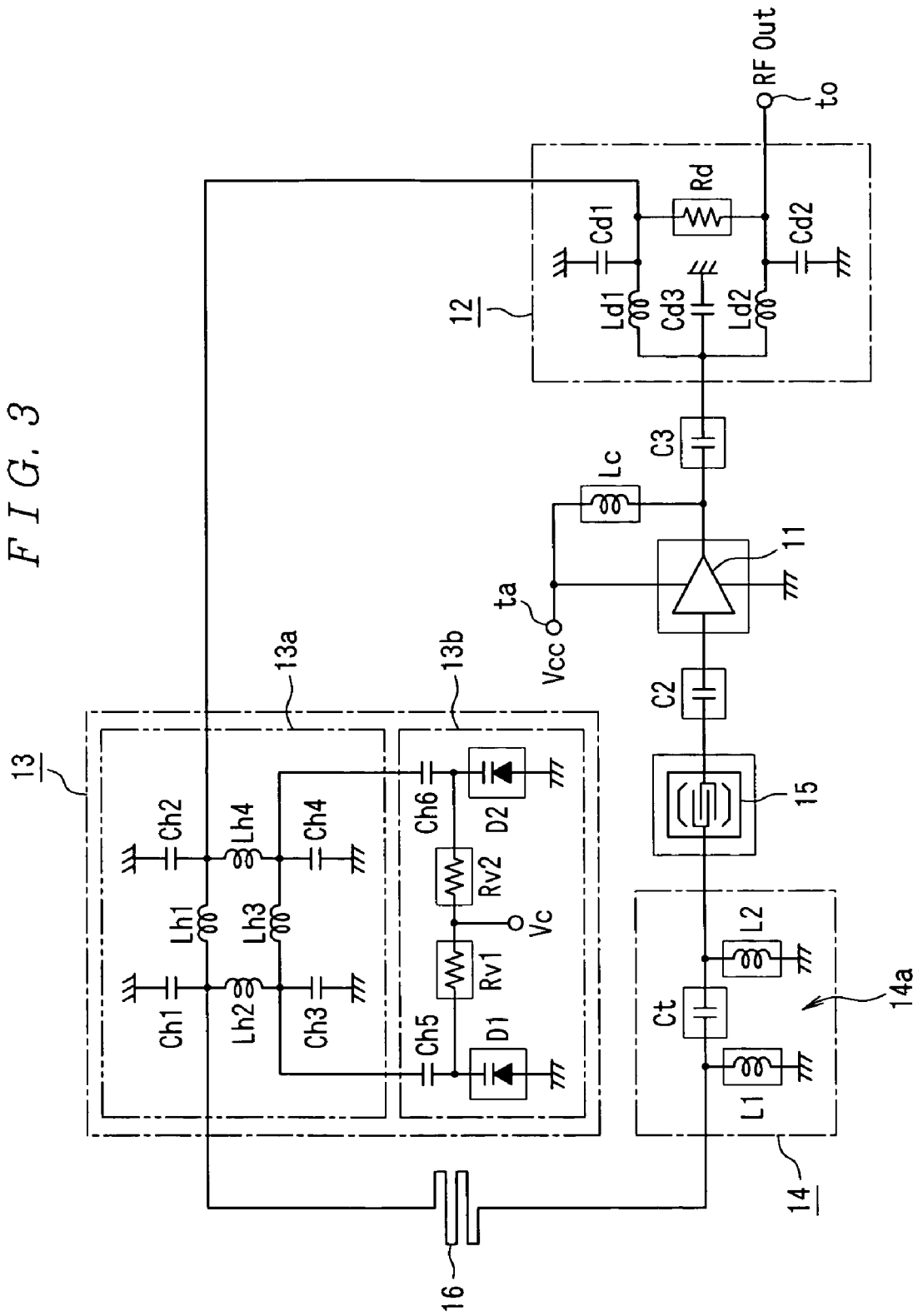
FIG. 3 is a block diagram showing a specific configuration of a voltage-controlled oscillator according to an embodiment of the present invention.

FIG. 3 is a block diagram showing a specific configuration of a voltage-controlled oscillator according to an embodiment of the present invention.

In FIG. 3, an equal power distributor 12, a phase shifter 13, a frequency adjuster 14, and a surface acoustic wave device 15 are provided in series as a feedback circuit on the input and output sides of an amplifier 11 for oscillation. These blocks are connected with each other and their impedance is matched to constant characteristic impedance, for example 50 ohms.

A power supply voltage Vcc is inputted through a power supply voltage input terminal ta into the amplifier 11. The input end of the amplifier 11 is connected to the output of the surface acoustic wave device 15 through a capacitor C2. The output end of the amplifier 11 is connected to the input of the equal power distributor 12 through a capacitor C3. A coil Lc is connected between the power supply voltage input terminal ta and a midway between the output of the amplifier 11 and the capacitor 3.

The equal power distributor 12 is used for equally distributing output power in an oscillation loop and outputting the power from the oscillation loop. Capacitors Cd1–Cd3, coils Ld1, Ld2, and a resistance Rd are provided in the equal power distributor 12.

Capacitor Cd2, coils Ld2 and Ld1, and capacitor Cd1 are connected in series in that order. Capacitor Cd3 is connected between coil Ld1 and coil Ld2. The output of the amplifier 11 is connected through the DC blocking capacitor C3. An input terminal of a −3 dB 90° hybrid coupler 13a of the phase shifter 13, which will be described later, is connected between capacitor Cd1 and coil Ld1. Connected between capacitor Cd2 and coil Ld2 is the output terminal to of the voltage-controlled oscillator. The resistance Rd is connected between the output terminal to and the input terminal of the hybrid coupler 13a.

The phase shifter 13, which receives a control voltage Vc from an outside source and changes the phase in the oscillation loop, includes a −3 dB 90° hybrid coupler 13a and an additional controller 13b.

Provided in the −3 dB 90° hybrid coupler 13a are capacitors Ch1–Ch4 and coils Lh1–Lh4.

The coils Lh1–Lh4 are connected in a loop. Capacitor Ch1 is connected between coil Lh1 and coil Lh2. Also connected between the coils Lh1 and Lh2 is an input of a delay line 16. Capacitor Ch3 is connected between coil Lh2 and Lh3. Capacitor Ch4 is connected between coil Lh3 and coil Lh4. Capacitor Ch2 is connected between coil Lh4 and coil Lh1. Also connected between coils Lh4 and Lh1 is an output of the equal power distributor 12.

The additional controller 13b is formed by a variable reactance circuit and includes capacitors Ch5, Ch6, resistances Rv1, Rv2, and variable capacitance diodes D1, D2.

Capacitor Ch5, resistance Rv1, resistance Rv2, and capacitor Ch6 are connected in that order in series between a midway between coil Lh2 and coil Lh3 and a midway between coil Lh3 and Lh4 of the −3 dB 90° hybrid coupler 13a. Variable capacitance diode D1 is connected between capacitor Ch5 and resistance Rv1 and variable capacitance diode D2 is connected between capacitor Ch6 and resistance Rv2. An input terminal for the control voltage Vc is provided between resistance Rv1 and resistance Rv2.

The frequency adjuster 14, which finely adjusts the phase in the oscillation loop, is formed by a high-pass filter 14a.

Provided in the high-pass filter 14a are a trim capacitor Ct and coils L1, L2. Coils L1 and L2 are respectively connected to opposite ends of the trim capacitor Ct. A terminal between the trim capacitor Ct and coil L1 is connected to the delay line 16 and a terminal between the trim capacitor Ct and coil L2 is connected to the surface acoustic wave device 15.

The delay line 16, which coarsely adjusts the phase in the oscillation loop in order to satisfy equation (2), which is the phase condition for causing oscillation cited above, is a line that is provided in rectangular form and has a constant characteristic impedance of 50 ohms, for example.

Figure 4A:
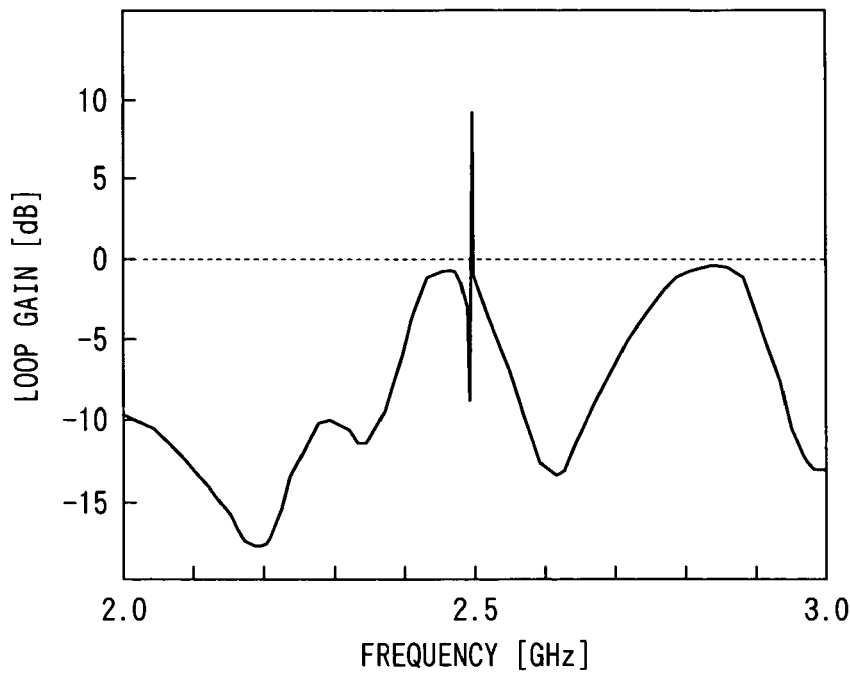
Figure 4B:
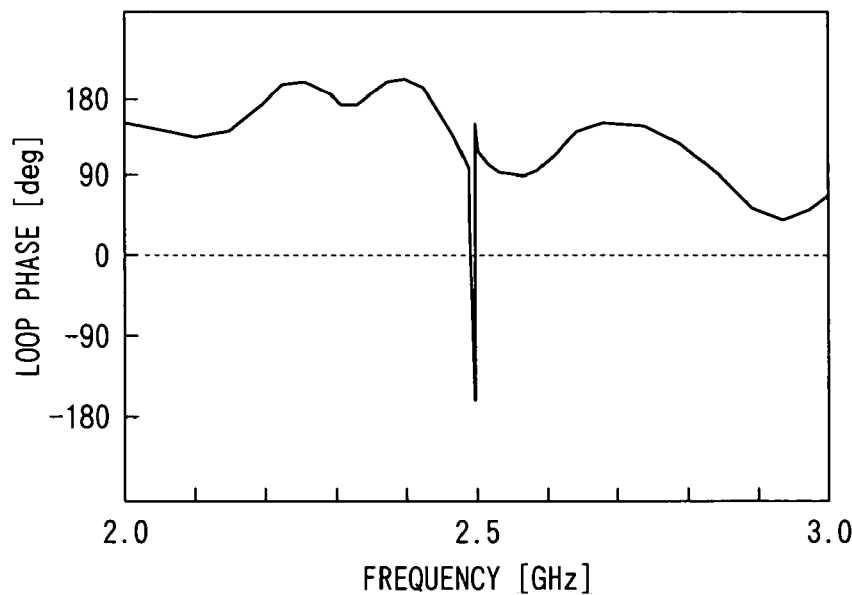

If the delay line of the voltage-controlled oscillator is provided in a single point between the phase shifter 13 and the frequency adjuster 14 apart from the surface acoustic wave device 15 in this way, the gain in the oscillation loop exceeds 0 dB and the phase in the oscillation loop becomes 0 degrees only at a desired frequency, which may be 2.5 GHz for example, as shown in FIGS. 4A and 4B. Thus, expressions (2) and (3) with zero phase, which represent the conditions for causing oscillation, are satisfied and therefore oscillation at a desired single frequency of 2.5 GHz can be achieved without abnormal oscillation at frequencies other than the desired frequency. In this way, stable proper oscillation can be caused at a desired frequency regardless of the power supply voltage of the voltage-controlled oscillator or the control voltage of the phase shifter 13.

Figure 5A:
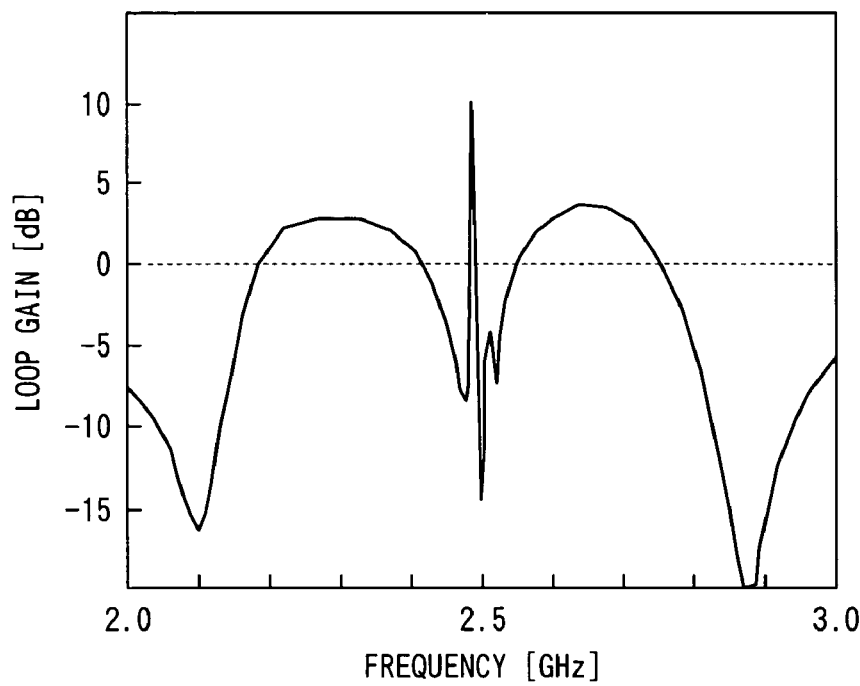
Figure 5B:
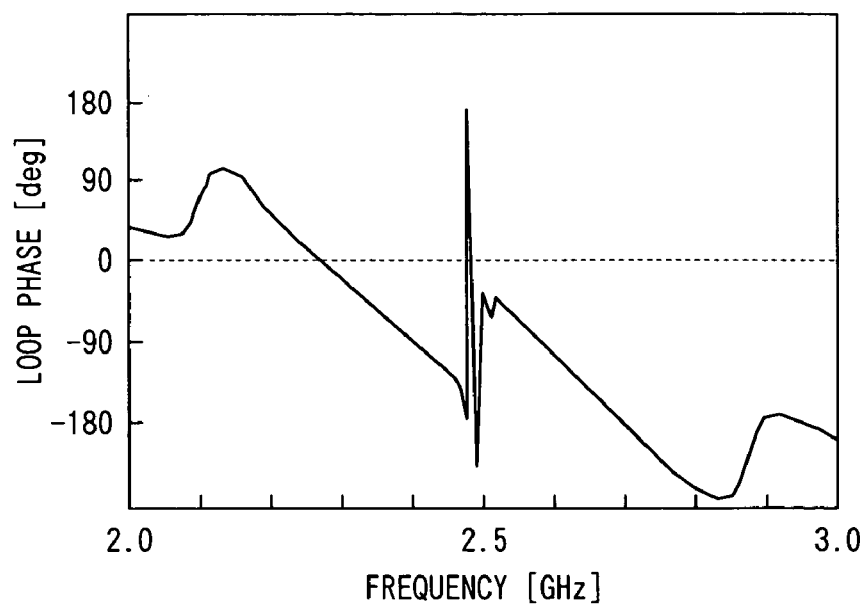

If delay lines are provided on both sides of the surface acoustic wave device 15, the gain in the oscillation loop exceeds 0 dB and the phase becomes 0 degrees at a desired frequency of 2.5 GHz as shown in FIGS. 5A and 5B and expressions (2) and (3) representing the conditions for causing oscillation are met, therefore oscillation is caused. However, the gain also exceeds 0 dB and the phase becomes 0 degrees at a frequency of 2.28 GHz, besides the desired frequency of 2.5 GHz, and the condition for oscillation are met. That is, abnormal oscillation can occur at a frequency of 2.28 GHz, depending on the power supply voltage of the voltage-controlled oscillator or the control voltage of the phase shifter 13. This is because the surface acoustic wave device 15, which is a resonant element, is coupled to the delay lines.

According to the present embodiment, the delay line is provided in a single position between the phase shifter 13 and the frequency adjuster 14. This reliably prevents abnormal oscillation and allows the oscillation conditions to be met and oscillation to occur only at the desired frequency that is the resonant frequency of the surface acoustic wave device 15.

Thus, stable oscillation can always be achieved without unstable oscillation regardless of the power supply voltage or the control voltage of the phase shifter 13. Therefore the problem of interference and coupling between circuits in a ceramic substrate that is associated with the Low Temperature Co-fired Ceramics substrate technology can be solved.

Figure 6:
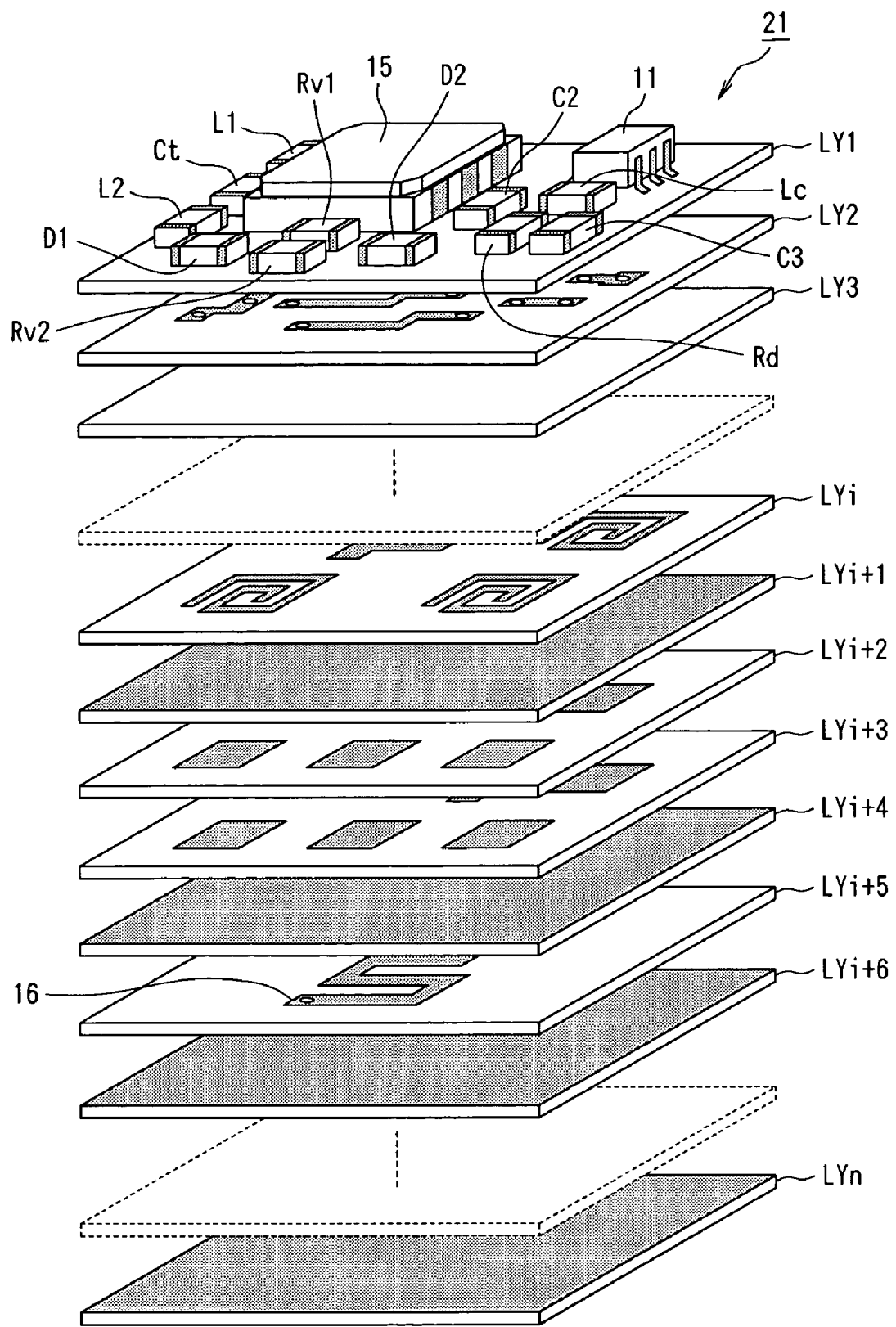
FIG. 6 is a perspective view showing a specific configuration of a voltage-controlled oscillator.

The devices in the solid-line rectangle, namely resistances Rd, Rv1, Rv2, coils Lc, L1, L2, capacitors C2, C3, Ct, and variable capacity diodes D1, D2 in FIG. 3 are implemented on an LTCC substrate 21, as shown in FIG. 6. The other capacitors, coils, the delay line, wiring lines, grounds, and other components are contained inside the LTCC substrate 21.

The LTCC substrate 21 has a multilayer structure consisting of 10 to 20 layers as shown in FIG. 6. The trim capacitor Ct and coils L1 and L2 making up the frequency adjuster 14 are mounted on a component mounting surface provided on the upper surface of a dielectric layer LY1 at the top of the multilayer structure. The surface acoustic wave device 15 is disposed to the right of the frequency adjuster 14 and the amplifier 11 is disposed to the right of the surface acoustic wave device 15. Disposed in front of the amplifier 11 are capacitor C2, coil Lc, resistance Rd, and capacitor C3. Disposed in front of the surface acoustic wave device 15 are resistances Rv1, Rv2 and variable capacitance diodes D1, D1 of the additional controller 13b in the phase shifter 13.

Provided under the dielectric layer LY1 is a line layer LY2 in which wiring lines between devices provided on the component implementation surface are formed. A ground layer LY3 is provided under the line layer LY2.

Provided several below the ground layer LY3 is a coil layer LYi in which inner-layer coils Ld1, Ld2, and Lh1–Lh4 are formed. Provided under the coil layer LYi is a ground layer LYi+1, under which there are provided a capacitor layers LYi+2 and LYi+3 in which inner-layer capacitors Cd1–Cd3 and Ch1–Ch6 are formed. Provided under the capacitor layer LYi+3 is a ground layer LYi+4, under which there is provided a delay line layer LYi+5 in which the delay line 16 is formed. Provided under the delay line layer LYi+5 is a ground layer LYi+6. At the bottom, there is also provided a ground layer LYn.

Via holes for electrically connecting the line layer LY2, coil layer LYi, capacitor layers LYi+2, LYi+3, delay line layer LYi+5, and other layers are provided appropriately in the ground layers LY3, LYi+1, LYi+4, and LYi+6.

Providing the voltage-controlled oscillator in the LTCC substrate 21 in this way allows passive elements such as capacitors and inductances to be layered in a ceramic substrate. Consequently, the number of surface-mounted components of the voltage-controlled oscillator can substantially be reduced and the size of the entire oscillator can also be reduced.

Because the delay line layer LYi+5 in which the delay line 16 is provided is separated by the ground layer LYi+4 from the dielectric layer LY1 in which the equal power distributor 12 and the phase shifter 13 are mounted, sufficient isolation can be ensured. Consequently, stable variable characteristics and output power characteristics with minimized variations can be achieved.

Figure 7:
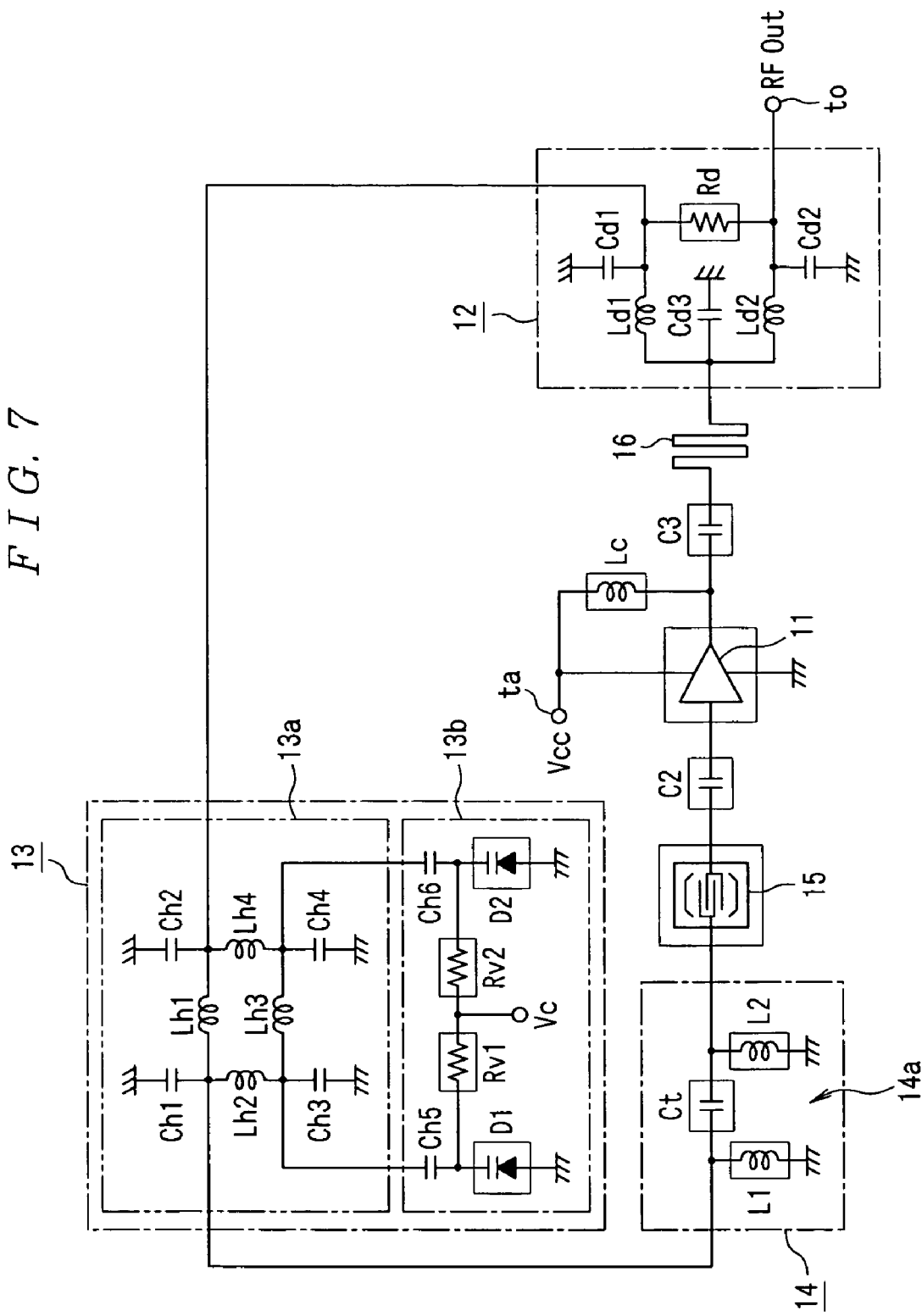
FIG. 7 is a block diagram showing another embodiment of the present invention.

While the delay line 16 is connected between the phase shifter 13 and frequency adjuster 14 in the embodiments described above, the present invention is not so limited. The delay line may be provided in a single position between the amplifier 11 and the equal power distributor 12 separated from the surface acoustic wave device 15 as shown in FIG. 7. This arrangement provides effects similar to those shown in FIGS. 4A and 4B. The conditions for causing oscillation are met only at a desired oscillation frequency and a proper, stable oscillation can be caused regardless of the power supply voltage or the control voltage of the phase shifter 13. It is essential only that the delay line 16 be concentrated in a place in the oscillation loop where coupling or interference does not occur.

While the frequency adjuster 14 is implemented by a π-high-pass filter consisting of one capacitor Ct and two coils L1, L2, the present invention is not so limited. The frequency adjuster 14 may be a π-low-pass filter consisting of one coil and two capacitors. Alternatively, a band-pass filter or a multistage filter may be used, depending on a desired oscillation frequency.

What is claimed is:

1. A voltage-controlled oscillator comprising:
   an amplifier;
   a surface acoustic wave device that forms a feedback circuit for said amplifier;
   a frequency adjuster that is provided in said feedback circuit and has a filter configuration;
   a phase shifter including a hybrid coupler having an additional controller that receives a control voltage from an external source and changes a phase in an oscillation loop;
   an equal power distributor that equally distributes output power in said oscillation loop and outputs the power to the outside of said oscillation loop; and
   a delay line concentratedly provided in a place where coupling or interference does not occur in said oscillation loop for correcting a phase condition in said oscillation loop.

2. The voltage-controlled oscillator according to claim 1, wherein said phase shifter, said equal power distributor, and said delay line are provided in a low temperature co-fired ceramics (LTCC) substrate.

3. The voltage-controlled oscillator according to claim 1, wherein said delay line is provided between said frequency adjuster and said phase shifter.

4. The voltage-controlled oscillator according to claim 1, wherein said delay line is provided between said amplifier and said phase shifter.

5. The voltage-controlled oscillator according to claim 2, wherein said delay line is separated by a ground layer in the lamination direction in a layer above or below a dielectric layer on which said phase shifter and said equal power distributor are provided.

6. The voltage-controlled oscillator according to claim 2, wherein said delay line is provided between said frequency adjuster and said phase shifter.

7. The voltage-controlled oscillator according to claim 2, wherein said delay line is provided between said amplifier and said phase shifter.

8. The voltage-controlled oscillator according to claim 3, wherein said delay line is separated by a ground layer in the lamination direction in a layer above or below a dielectric layer on which said phase shifter and said equal power distributor are provided.

9. The voltage-controlled oscillator according to claim 4, wherein said delay line is separated by a ground layer in the lamination direction in a layer above or below a dielectric layer on which said phase shifter and said equal power distributor are provided.

* * * * *